(12) United States Patent
Nishi et al.

(10) Patent No.: US 10,274,138 B2
(45) Date of Patent: Apr. 30, 2019

(54) LIGHTING DEVICE AND LIGHTING SYSTEM

(71) Applicant: PANASONIC INTELLECTUAL PROPERTY MANAGEMENT CO., LTD., Osaka (JP)

(72) Inventors: Tetsuya Nishi, Osaka (JP); Hiroshi Kitano, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/671,330

(22) Filed: Aug. 8, 2017

(65) Prior Publication Data

US 2018/0051855 A1 Feb. 22, 2018

(30) Foreign Application Priority Data

Aug. 22, 2016 (JP) .................... 2016-161650

(51) Int. Cl.

| | |
|---|---|
| *F21K 9/61* | (2016.01) |
| *F21K 9/64* | (2016.01) |
| *F21K 9/69* | (2016.01) |
| *H01S 5/00* | (2006.01) |
| *H01S 5/40* | (2006.01) |
| *F21K 9/68* | (2016.01) |
| *F21V 7/04* | (2006.01) |
| *H01S 5/022* | (2006.01) |
| *H01S 5/323* | (2006.01) |
| *F21V 29/74* | (2015.01) |
| *F21Y 115/30* | (2016.01) |
| *F21V 9/35* | (2018.01) |

(52) U.S. Cl.
CPC .............. *F21K 9/64* (2016.08); *F21K 9/61* (2016.08); *F21K 9/68* (2016.08); *F21K 9/69* (2016.08); *H01S 5/005* (2013.01); *H01S 5/4025* (2013.01); *F21V 7/04* (2013.01); *F21V 9/35* (2018.02); *F21V 29/74* (2015.01); *F21Y 2115/30* (2016.08); *H01S 5/0071* (2013.01); *H01S 5/02284* (2013.01); *H01S 5/32341* (2013.01)

(58) Field of Classification Search
CPC ................................ F21K 9/64; H01S 5/005
See application file for complete search history.

(56) References Cited

U.S. PATENT DOCUMENTS

| | | | | |
|---|---|---|---|---|
| 8,502,695 | B2 * | 8/2013 | Kishimoto | F21K 9/00 340/815.57 |
| 2014/0063779 | A1 * | 3/2014 | Bradford | F21K 9/1375 362/84 |
| 2015/0062943 | A1 * | 3/2015 | Takahira | F21S 41/675 362/510 |

FOREIGN PATENT DOCUMENTS

| | | |
|---|---|---|
| JP | 2008-108553 A | 5/2008 |
| JP | 2012-048975 A | 3/2012 |

\* cited by examiner

*Primary Examiner* — Evan P Dzierzynski
(74) *Attorney, Agent, or Firm* — Greenblum & Bernstein, P.L.C.

(57) ABSTRACT

A lighting device is provided which includes: a wavelength converter that emits, from laser light, light having a wavelength different from a wavelength of the laser light; and a reflector surrounding the wavelength converter and including a surface of revolution that reflects the light emitted from the wavelength converter. The reflector includes, in the surface of revolution, a through-hole through which the laser light passes.

20 Claims, 7 Drawing Sheets

LIGHTING DEVICE AND LIGHTING SYSTEM

CROSS REFERENCE TO RELATED APPLICATION

This application claims the benefit of priority of Japanese Patent Application Number 2016-161650 filed on Aug. 22, 2016, the entire content of which is hereby incorporated by reference.

BACKGROUND

1. Technical Field

The present disclosure relates to a lighting device and a lighting system which use laser light emitted from a light source.

2. Description of the Related Art

A lighting device is conventionally known which emits light by exciting, using laser light as excitation light, phosphors dispersed in a wavelength converter, so that the wavelength converter converts the laser light into visible light of a desired color. With such a lighting device, laser light output from a laser diode is guided to a region near the wavelength converter using an optical fiber, and the laser light emitted from an end portion of the optical fiber irradiates the wavelength converter. Thus, the end portion of the optical fiber is disposed at a position where the end portion of the optical fiber does not block the visible light emitted from the wavelength converter (see Japanese Unexamined Patent Application Publication No. 2008-108553, for example).

SUMMARY

However, with a lighting device that achieves desired light, distribution by having a reflector in a region surrounding the wavelength converter, an end portion of the optical fiber needs to be disposed outside the reflector, thereby increasing the distance between an end surface of the optical fiber that emits laser light and the wavelength converter. Conversely, laying the optical fiber over the reflector to a region near the wavelength converter causes the emitted visible light to have a blurred portion due to the optical fiber.

In view of the above circumstances, it is an object of the present disclosure to provide a lighting device and a lighting system which use laser light emitted from a light source and achieve substantially axially-symmetric light distribution.

It should be noted that the term "substantially axially-symmetric" in the Specification and the Claims is used to allow a certain amount of error and to include imperfect axial symmetry, as well as perfect axial symmetry.

A lighting device according to an aspect of the present disclosure is a lighting device including: a wavelength converter that emits, from laser light, light having a wavelength different from a wavelength of the laser light; and a reflector surrounding the wavelength converter and including a surface of revolution that reflects the light emitted from the wavelength converter, wherein the reflector includes, in the surface of revolution, at least one through-hole through which the laser light passes.

According to the present disclosure, it is possible to provide a lighting device which uses laser light emitted from a light source and emits visible light with substantially axially-symmetric light distribution.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF EMBODIMENT

Figure 1:
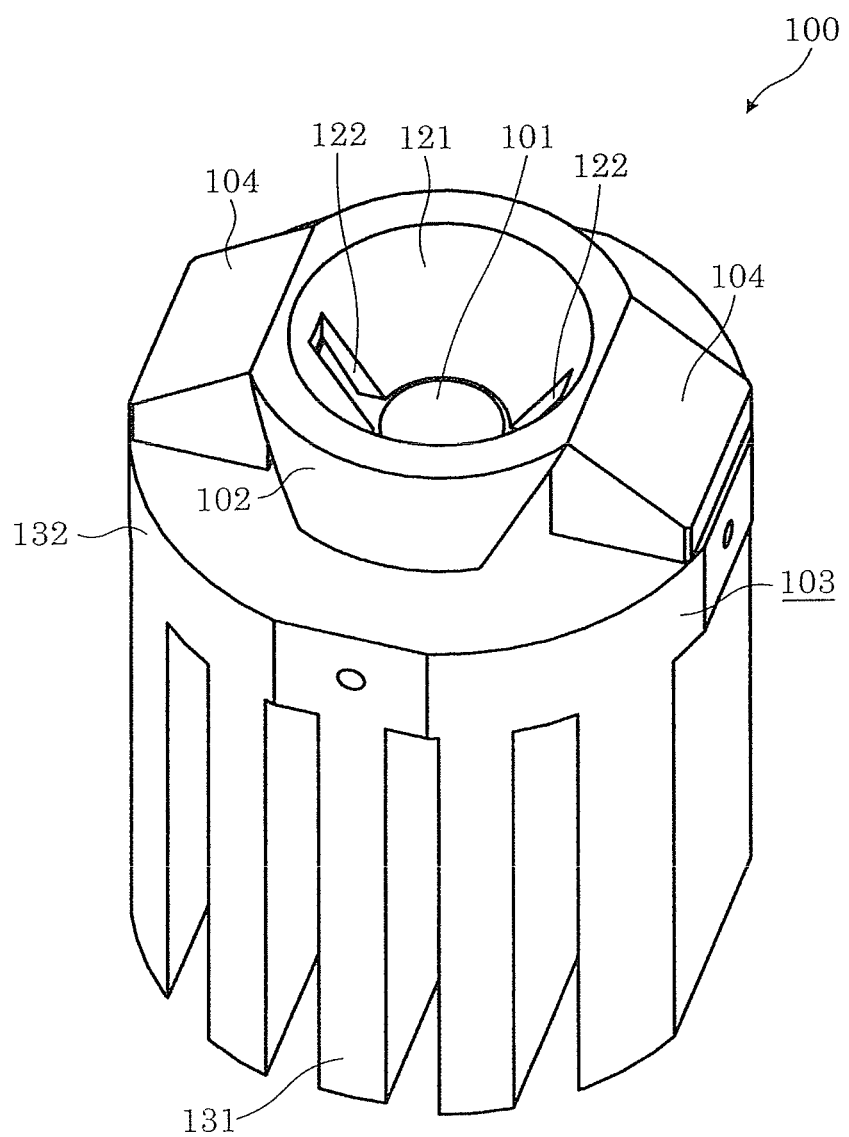
FIG. 1 is a perspective view illustrating an exterior appearance of a lighting device according to an embodiment.

Hereinafter, a lighting device according to an embodiment of the present disclosure will be described with reference to the drawings. It should be noted that the embodiment and variations thereof described below are to show specific examples of the present disclosure. Therefore, the numerical values, shapes, materials, structural elements, and the arrangement and connection of the structural elements, etc., shown in the following embodiment and variations are mere examples, and are therefore not intended to limit the present disclosure. As such, among the structural elements in the following embodiment and variations, elements not recited in any one of the independent claims indicating the broadest inventive concepts will be described as arbitrary structural elements.

It should also be noted that each drawing is a schematic illustration and not necessarily a precise illustration. Furthermore, in the drawings, like reference signs are given to like structural elements, and the description of such structural elements may not be repeated.

Embodiment

[Outline of Configuration of Lighting Device]

FIG. 1 is a perspective view illustrating an exterior appearance of a lighting device according to an embodiment.

Lighting device 100 illustrated in FIG. 1 emits, from laser light L (see FIG. 3), visible light having a wavelength different from the wavelength of laser light L, and is, for example, a spotlight that illuminates an indoor or outdoor predetermined place. Lighting device 100 includes wavelength converter 101 and reflector 102, and further includes base 103 and irradiator 104.

Figure 2:
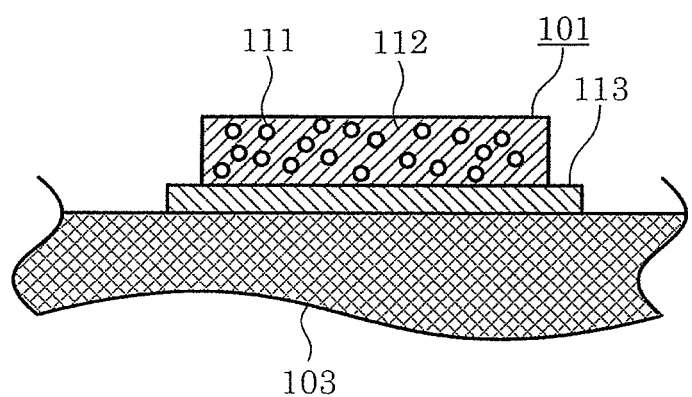
FIG. 2 is a cross sectional view illustrating a wavelength converter according to the embodiment.

FIG. 2 is a cross sectional view illustrating a wavelength converter.

Wavelength converter 101 converts, using laser light L as excitation light, laser light L into visible light having a wavelength different from the wavelength of laser light L, and includes wavelength converting material 111, base material 112, and reflective plate 113.

Wavelength converting material 111 is a substance that emits fluorescence using laser light L as excitation light. In the present embodiment, wavelength converting material 111 is a yellow phosphor that emits yellow fluorescence using blue laser light L. Specifically, an yttrium aluminum garnet (YAG) phosphor is an example of the yellow phosphor.

In the present embodiment, a portion of blue laser light L is wavelength-converted into yellow light by wavelength converting material 111 included in wavelength converter 101. Blue light not absorbed by wavelength converting material 111 and the yellow light obtained through the wavelength conversion by the yellow phosphor are then diffused and mixed in wavelength converter 101. As a result, wavelength converter 101 emits white light.

Base material 112 can hold wavelength converting material 111 dispersedly, and transmit laser light L and the fluorescence emitted from wavelength converting material 111. Although not particularly limited, examples of the material of base material 112 include an organic material such as a methyl silicone resin, an epoxy resin, or a urea resin, and an inorganic material such as glass or ceramics. When heat resistance is required in particular, an inorganic material is selected.

Reflective plate 113 reflects laser light L and the fluorescence emitted from wavelength converter 101. Although not particularly limited, examples of the material that forms reflective plate 113 include a plate-shaped component containing a metal material such as aluminum or an aluminum alloy, and a plate-shaped component having a metal layer formed on a surface of a glass substrate.

It should be noted that in the present embodiment, wavelength converter 101 is formed by, for example, applying or printing base material 112 containing a wavelength converting material onto a surface of reflective plate 113. Although the shape etc., of wavelength converter 101 is not particularly limited, base material 112 and reflective plate 113 in the present embodiment have a disc shape, and are coaxially arranged with surface of revolution 121 of later-described reflector 102 about revolution axis 120 (see FIG. 3).

Reflector 102 has surface of revolution 121 that surrounds wavelength converter 101 and that reflects light emitted from wavelength converter 101. Reflector 102 includes, in a portion of surface of revolution 121, through-holes 122 through which laser light L passes.

Here, surface of revolution 121 is a curved surface obtained by rotating, about revolution axis 120, a curved or straight line disposed in space. In the present embodiment, revolution axis 120 coincides with the optical axis. When viewed along revolution axis 120, surface of revolution 121 is axially symmetric; the shape of surface of revolution 121 does not change in the circumferential direction, and the distance from revolution axis 120 to surface of revolution 121 changes depending on the position on revolution axis 120. It should be noted that because end portions of through-holes 122 are open in portions of surface of revolution 121, surface of revolution 121 is, at least partially, not perfectly axially-symmetric. In the present embodiment, at least the open end of surface of revolution 121 and the nearby region are axially symmetric.

In the present embodiment, reflector 102 includes through-holes 122 at two positions, and two through-holes 122 are equally spaced in the circumferential direction, that is, two through-holes 122 are disposed at such positions where two through-holes 122 match each other when rotated 180 degrees about revolution axis 120.

Further, surface of revolution 121 of reflector 102 is bowl-shaped, that is, the open area gradually increases with an increase in distance from wavelength converter 101. Through-holes 122 have an elongated slit shape along revolution axis 120 of surface of revolution 121. This makes it possible to reduce the occurrence of the walls of through-holes 122 blocking laser light L that obliquely travels toward wavelength converter 101 and to suppress the influence that through-holes 122 have on light distribution of lighting device 100.

It should be noted that although the material that forms reflector 102 is not particularly limited, forming reflector 102 with a material having high heat conductivity such as metal allows heat generated by wavelength converter 101 to be dissipated also by reflector 102.

Surface of revolution 121 may have minute asperities thereon by texturing, for example.

Base 103 includes: main body 132 holding wavelength converter 101, reflector 102, and irradiator 104; and heat dissipating fins 131 that dissipate into the external space the heat generated by wavelength converter 101. Heat dissipating fins 131 are integrally formed with main body 132, at positions across main body 132 from wavelength converter 101.

Although the material that forms base 103 is not particularly limited, a material having high heat conductivity such as metal may be used.

Figure 3:
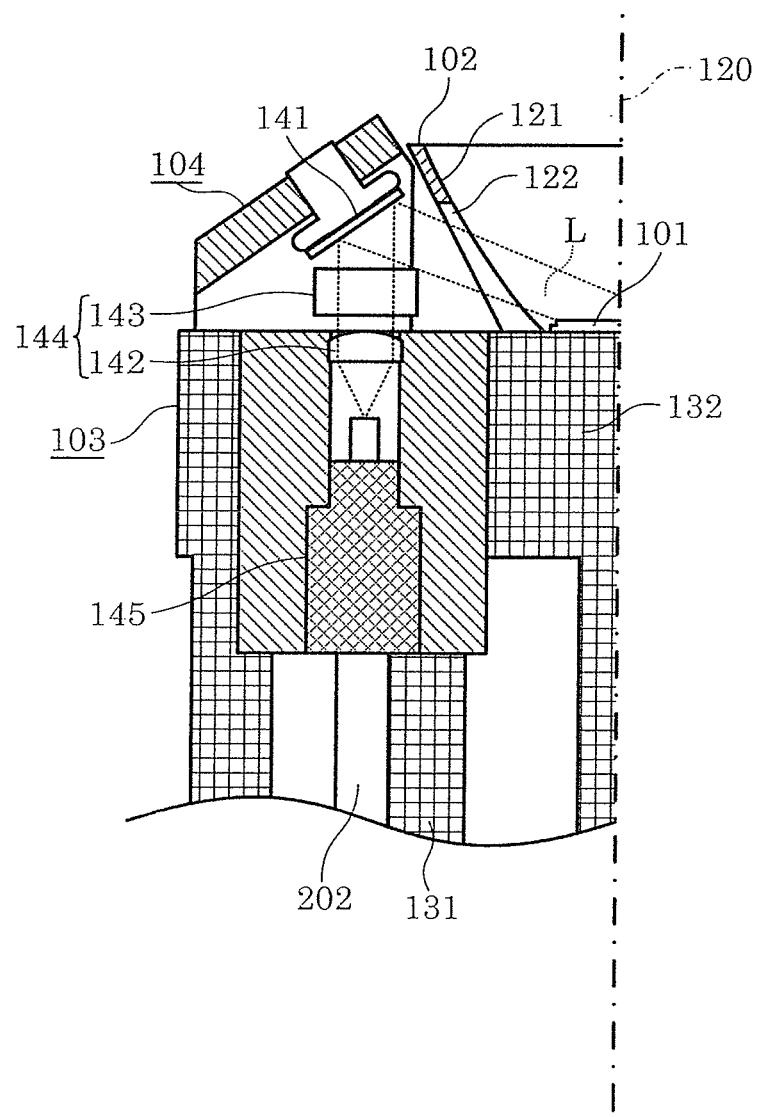
FIG. 3 is a cross sectional view illustrating an irradiator and the nearby region according to the embodiment.

FIG. 3 is a cross sectional view illustrating an irradiator and the nearby region.

As illustrated in FIG. 3, irradiator 104 holds an end portion of optical fiber 202 that guides laser light L, mirror 141, and lens system 144, and is removably attached to base 103.

Irradiator 104 enables collective assembly of optical components such as mirror 141 and lens system 144, which require highly precise positional adjustment.

Figure 4:
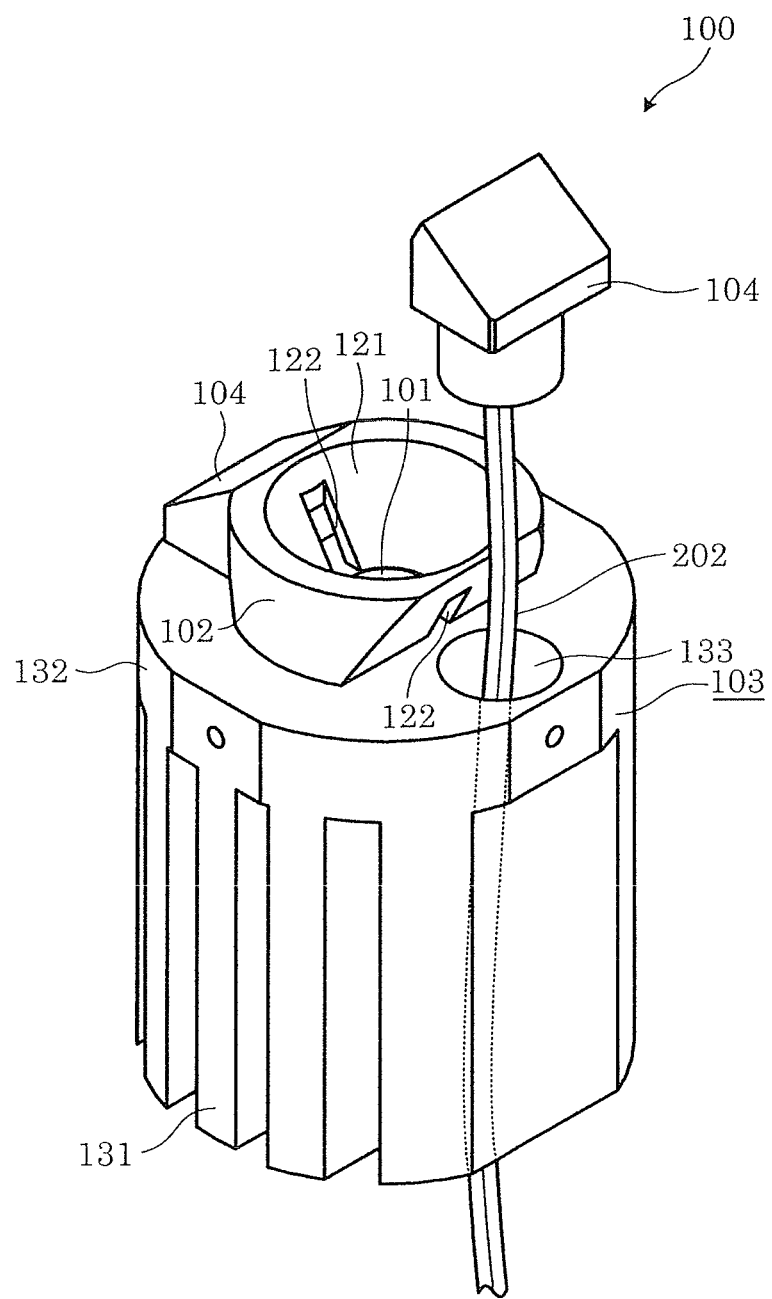
FIG. 4 is an exploded perspective view illustrating a state in which an irradiator is removed from a base according to the embodiment.

FIG. 4 is an exploded perspective view illustrating a state in which the irradiator is removed from the base.

As illustrated in FIG. 4, main body 132 of base 103 includes holding hole 133 for (i) inserting optical fiber 202 that guides laser light L to allow laser light L to pass through through-hole 122 and (ii) inserting and attaching irradiator 104.

This enables accurate alignment of irradiator 104 with respect to wavelength converter 101 attached to base 103. Furthermore, because optical fiber 202 can be laid without being disposed outside base 103, it is possible to easily install lighting device 100 in a hole provided in a construction material such as a ceiling.

Irradiator 104 includes connector 145 which allows irradiator 104 and optical fiber 202 to be removably attached to each other. This allows optical fiber 202 inserted through holding hole 133 to be connected to irradiator 104 removed from base 103, and allows irradiator 104 connected with optical fiber 202 to be attached to base 103. Accordingly, it becomes easier to install lighting device 100.

Mirror 141 reflects laser light L emitted from an end portion of optical fiber 202 attached to irradiator 104, and irradiates wavelength converter 101 with reflected laser light L. This eliminates the need to bend optical fiber 202 in order to irradiate wavelength converter 101 with laser light L. Moreover, since there is no need to secure space for moderately bending optical fiber 202, lighting device 100 can be made smaller in size.

Lens system 144 is for efficiently irradiating wavelength converter 101 with laser light L emitted from the end portion of optical fiber 202, and includes first lens 142 and second lens 143.

First lens 142 is what is known as a collimating lens that converts laser light L emitted radially from the end portion of optical fiber 202 into parallel light having a predetermined diameter.

Second lens 143 is for matching, with the shape of wavelength converter 101, the shape of the region irradiated with laser light L obliquely entering the surface of wavelength converter 101. In the present embodiment, because the shape of the surface of wavelength converter 101 is a substantially perfect circle, a cylindrical lens which can approximate the shape of the region irradiated with obliquely entering laser light L to a perfect circle is used as second lens 143. This allows the entirety of wavelength converter 101 to emit visible light.

Next, lighting system 200 according to the embodiment will be described.

Figure 5:
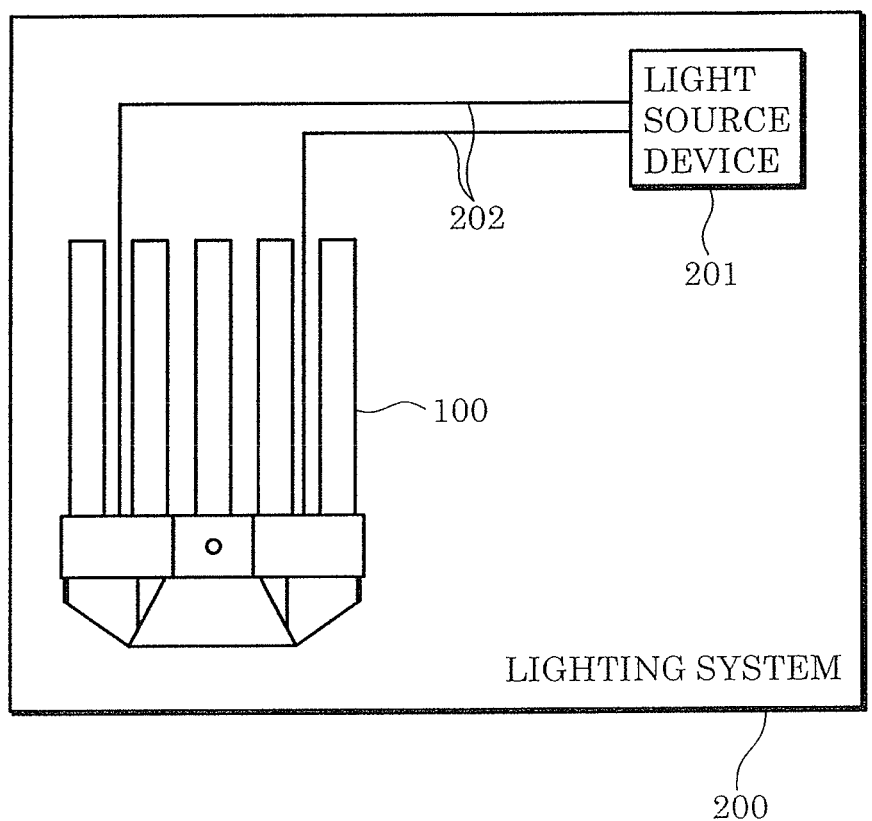
FIG. 5 is a block diagram illustrating a lighting system according to the embodiment.

FIG. 5 is a block diagram illustrating a lighting system.

As illustrated in FIG. 5, lighting system 200 is a spotlight installed on, for example, a ceiling of a building to emit visible light toward a floor, and includes: lighting device 100 described above; light source device 201; and optical fiber 202.

Light source device 201 generates laser light L, and supplies laser light L to lighting device 100 via optical fiber 202. Light source device 201 includes one or more semiconductor laser elements that emit laser light L having a wavelength in the blue-violet to blue region (400 nm to 490 nm), for example.

In the present embodiment, light source device 201 is adjusted such that the power of laser light L emitted from one of two irradiators 104 included in lighting device 100 to wavelength converter 101 via corresponding through-hole 122 is equal to the power of laser light L emitted from the other one of two irradiators 104 to wavelength converter 101 via corresponding through-hole 122. Specifically, for example, the respective powers of laser light L irradiating wavelength converter 101 can be made equal by (i) connecting optical fiber 202 to each one of semiconductor laser elements having the same output, (ii) tying these optical fibers 202 into a pair of bundles such that each bundle has the same number of optical fibers 202, and (iii) connecting each bundle to a different one of irradiators 104.

With this, laser light L from two irradiators 104 passes through through-holes 122 equally spaced in the circumferential direction, and geometrically equally (rotationally symmetrically) irradiates wavelength converter 101. Further, the respective powers of laser light L are equal. Thus, wavelength converter 101 emits visible light that is axially symmetric about revolution axis 120. In addition, as a result of the visible light being reflected by surface of revolution 121 disposed about the optical axis of the visible light, it is possible to achieve light distribution which is axially symmetric about the optical axis (revolution axis 120).

[Advantageous Effects Etc]

As described above, lighting device 100 according to the present embodiment is lighting device 100 including: wavelength converter 101 that emits, from laser light L, light having a wavelength different from a wavelength of laser light L; and reflector 101 surrounding wavelength converter 101 and including surface of revolution 121 that reflects the light emitted from wavelength converter 101, wherein reflector 102 includes, in surface of revolution 121, at least one through-hole 122 through which laser light L passes.

According to this configuration, since substantially axially-symmetric surface of revolution 121 can reflect visible light emitted from wavelength converter 101, it is possible to achieve light distribution that is substantially axially-symmetric about the optical axis.

Specifically, reflector 102 of lighting device 100 according to the present embodiment includes a plurality of through-holes 122, and the plurality of through-holes 122 are equally spaced along surface of revolution 121.

According to this configuration, the pattern for irradiating wavelength converter 101 with laser light L, which is excitation light, is substantially symmetric, and it is thus possible to emit visible light from wavelength converter 101 in a substantially symmetric manner. Furthermore, space for providing irradiator 104 to base 103 can be more easily secured.

Further, surface of revolution 121 of reflector 102 includes an open area that gradually increases with an increase in distance from wavelength converter 101, and through-hole 122 is elongated along a revolution axis of surface of revolution 121.

According to this configuration, the proportion of the area of the opening of through-hole 122 to the area of surface of revolution 121 can be kept low, which means that the area for reflecting the visible light emitted from wavelength converter 101 can be increased. In addition, the influence that the opening of through-hole 122 has on the light distribution can be reduced.

Further, respective powers of laser light L passing through the plurality of through-holes 122 are equal.

According to this configuration, the irradiation patterns of laser light L, as well as the powers of laser light L, can be equalized, and thus the visible light can be evenly emitted from wavelength converter 101, thereby making it possible to easily achieve light distribution that is axially symmetric about the optical axis.

Further, lighting device 100 includes base 103 including (i) main body 132 holding wavelength converter 101 and (ii) heat dissipating fins 131 disposed across main body 132 from wavelength converter 101, wherein main body 132 of base 103 includes holding hole 133 which allows optical fiber 202 guiding laser light L to be laid between heat dissipating fins 133, and which allows an end portion of optical fiber 202 to be disposed on a side on which wavelength converter 101 is disposed.

According to this configuration, one or more optical fibers 202 can be disposed on the side where heat dissipating fins 131 are provided, and thus it makes it easier to handle the one or more optical fibers 202 when installing lighting device 100.

Further, lighting device 100 further includes mirror 141 that reflects laser light L emitted from optical fiber 202 and irradiates wavelength converter 101 with laser light L.

According to this configuration, laser light L emitted from optical fiber 202 can be bent at an acute angle to irradiate wavelength converter 101, thereby making it possible to reduce the size of lighting device 100 as a whole.

Furthermore, lighting device 100 further includes irradiator 104 that holds mirror 141 and an end portion of optical fiber 202, and is removably attached to base 103. Reflector 102 is also removably attached to base 103.

According to this configuration, each component having a predetermined function can be constituted as a module, and each module can be used as a component common to lighting devices 100 of different types. In particular, treating irradiator 104 as a separate component enables adjustment of the path of laser light L, that is, adjustment of the position and angle of the optical components, in a separate process.

It should be noted that the present disclosure is not limited to the above embodiment. For example, different embodiments achieved by any combination of the structural elements described in this Specification and embodiments achieved by excluding some of the structural elements may be considered as the embodiments of the present disclosure. Furthermore, variations achieved through various modifications to the above embodiment that can be conceived by a person of ordinary skill in the art without departing from the essence of the present disclosure, that is, the meaning of the recitations in the claims, are included in the present disclosure.

Figure 6:
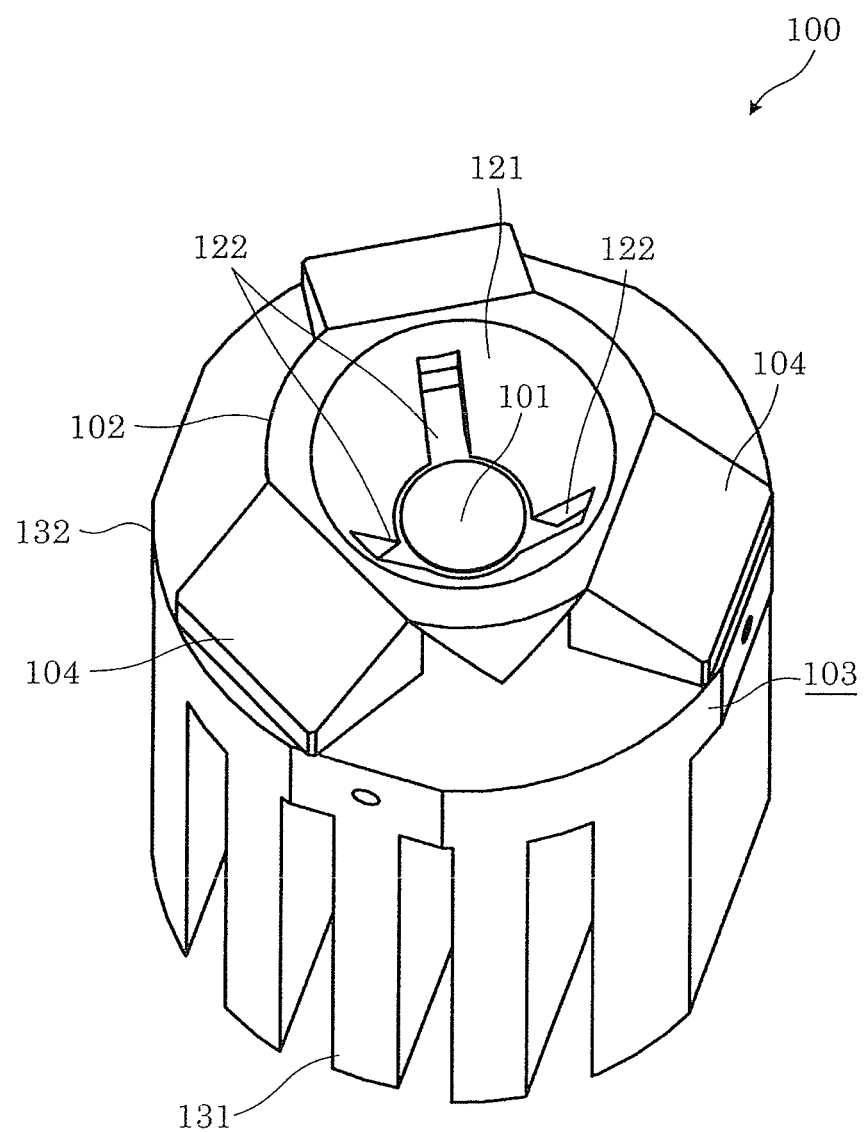
FIG. 6 is a perspective view illustrating an exterior appearance of a lighting device according to a variation of the embodiment.

For example, lighting device 100 may include three or more equally spaced through-holes 122 and irradiators 104 as illustrated in FIG. 6.

The openings of through-holes 122 need not have a slit-like shape and may have any shape such as an elliptical shape.

Wavelength converter 101 need not include reflective plate 113 and may be directly attached to base 103.

Figure 7:
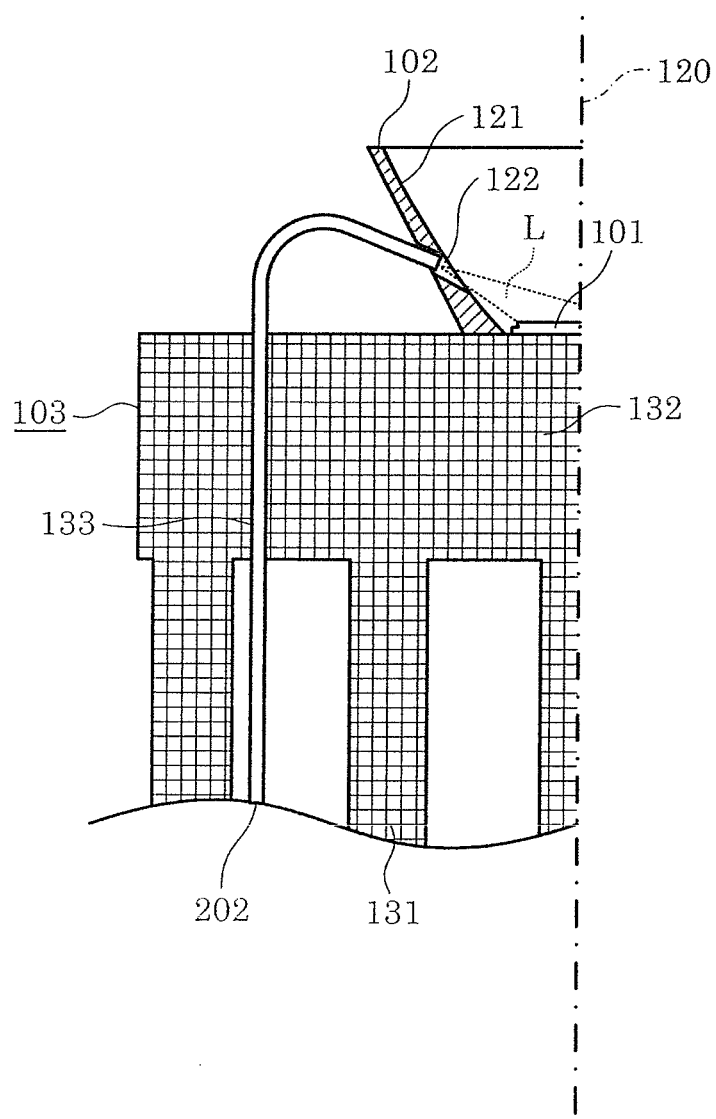
FIG. 7 is a cross sectional view illustrating a cross section of a lighting device according to a variation of the embodiment.

As illustrated in FIG. 7, wavelength converter 101 may be irradiated with laser light L by bending optical fiber 202, without the use of a mirror, for example. In this case, an end portion of optical fiber 202 may be inserted into through-hole 122.

A light-transmissive cover may be disposed in front of wavelength converter 101 and reflector 102. The cover may contain a material such as glass or resin, and may, for example, have a role of reducing adherence of a foreign substance such as dust to wavelength converter 101. Further, the cover may have an optical function such as light diffusion or light concentration.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A lighting device, comprising:
   a wavelength converter that emits, from laser light, light having a wavelength different from a wavelength of the laser light; and
   a reflector surrounding the wavelength converter and including a surface of revolution that reflects the light emitted from the wavelength converter, wherein
   the reflector includes, in the surface of revolution, at least one through-hole through which the laser light passes,
   the surface of revolution of the reflector includes an open area that gradually increases with an increase in distance from the wavelength converter, and
   the through-hole is elongated along a revolution axis of the surface of revolution.

2. The lighting device according to claim 1, wherein
   the reflector includes a plurality of the through-hole, and
   the plurality of the through-hole is equally spaced along the surface of revolution.

3. The lighting device according to claim 2, wherein
   the laser light is emitted from a plurality of light source devices,
   the laser light emitted from each of the plurality of light source devices passes through one of the plurality of the through-hole, and
   the light emitted by the wavelength converter is from the laser light of the plurality of light source devices and is axially symmetric about a revolution axis of the surface of revolution.

4. The lighting device according to claim 3, wherein
   respective powers of the laser light passing through each of the plurality of the through-hole are equal.

5. The lighting device according to claim 2, wherein
   each of the plurality of the through-hole includes one of an elongated slit shape and an elliptical shape.

6. The lighting device according to claim 1, wherein
   the surface of revolution is obtained by rotating a line about the revolution axis.

7. The lighting device according to claim 6, wherein
   the line is one of a straight line and a curved line.

8. The lighting device according to claim 6, wherein
   the surface of revolution is axially symmetric.

9. The lighting device according to claim 6, wherein
   the surface of revolution is at least partially not axially symmetric.

10. The lighting device according to claim 6, wherein
    the surface of revolution includes asperities.

11. The lighting device according to claim 1, further comprising
    a base including a main body and heat dissipating fins, the base holding the wavelength converter, the heat dissipating fins being disposed across the main body from the wavelength converter, wherein
    the main body of the base includes a holding hole that holds a portion of an optical fiber that guides the laser light, the optical fiber being disposed between the heat dissipating fins.

12. The lighting device according to claim 11, further comprising
    a mirror that reflects the laser light emitted from the optical fiber and irradiates the wavelength converter with the laser light.

13. The lighting device according to claim 12, wherein
    the mirror includes a plurality of lenses, the plurality of lenses including a first lens that converts the laser light into parallel light and a second lens that matches a shape of the wavelength converter.

14. The lighting device according to claim 12, further comprising
    an irradiator that holds the mirror and an end portion of the optical fiber, and is removably attached to the base.

15. The lighting device according to claim 1, wherein
    the wavelength converter includes a wavelength converting material, a base material, and a reflective plate.

16. The lighting device according to claim 15, wherein
    the base material and the reflective plate of the wavelength converter are coaxially arranged with the surface of revolution of the reflector.

17. The lighting device according to claim 15, wherein
    the wavelength converting material converts a first portion of the laser light having a first color into wavelength-converted light having a second color different than the first color, and
    the wavelength converter diffuses and mixes a second portion of the laser light having the first color and the wavelength-converted light having the second color to emit the light having a third color different than the first color and the second color.

18. A lighting system, comprising:
a light source device that generates laser light;
an optical fiber that guides the laser light emitted from the light source device;
a wavelength converter that emits, from the laser light guided by the optical fiber, light having a wavelength different from a wavelength of the laser light; and
a reflector surrounding the wavelength converter and including a surface of revolution that reflects the light emitted from the wavelength converter, wherein
the reflector includes at least one through-hole in the surface of revolution and through which the laser light passes,
the surface of revolution of the reflector includes an open area that gradually increases with an increase in distance from the wavelength converter, and
the through-hole is elongated along a revolution axis of the surface of revolution.

19. A lighting device, comprising:
a wavelength converter that emits, from laser light, light having a wavelength different from a wavelength of the laser light;
a reflector surrounding the wavelength converter and including a surface of revolution that reflects the light emitted from the wavelength converter;
a base including a main body and heat dissipating fins, the base holding the wavelength converter, the heat dissipating fins being disposed across the main body from the wavelength converter;
a mirror that reflects the laser light emitted from the optical fiber and irradiates the wavelength converter with the laser light; and
an irradiator that holds the mirror and an end portion of the optical fiber, and is removably attached to the base, wherein
the reflector includes, in the surface of revolution, at least one through-hole through which the laser light passes, and
the main body of the base includes a holding hole that holds a portion of an optical fiber that guides the laser light, the optical fiber being disposed between the heat dissipating fins.

20. The lighting device according to claim 19, wherein the reflector is further removably attached to the base.

* * * * *